(12) United States Patent
Lee et al.

(10) Patent No.: US 11,532,782 B2
(45) Date of Patent: Dec. 20, 2022

(54) SEMICONDUCTOR DEVICES INCLUDING SPIN-ORBIT TORQUE LINE AND CONTACT PLUG

(71) Applicant: Samsung Electronics Co., Ltd., Suwon-si (KR)

(72) Inventors: Kil Ho Lee, Hwaseong-si (KR); Woo Jin Kim, Hwaseong-si (KR); Gwan Hyeob Koh, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/330,969

(22) Filed: May 26, 2021

(65) Prior Publication Data

US 2021/0280774 A1    Sep. 9, 2021

Related U.S. Application Data

(63) Continuation of application No. 16/506,391, filed on Jul. 9, 2019, now Pat. No. 11,050,016.

(30) Foreign Application Priority Data

Jan. 14, 2019  (KR) .................. 10-2019-0004423

(51) Int. Cl.
| | | |
|---|---|---|
| *H01L 43/02* | (2006.01) | |
| *G11C 11/16* | (2006.01) | |
| *H01L 27/22* | (2006.01) | |
| *H01L 43/12* | (2006.01) | |
| *G11C 11/18* | (2006.01) | |
| *H01L 43/08* | (2006.01) | |

(52) U.S. Cl.
CPC ............ *H01L 43/02* (2013.01); *G11C 11/161* (2013.01); *G11C 11/18* (2013.01); *H01L 27/222* (2013.01); *H01L 27/228* (2013.01); *H01L 43/12* (2013.01); *H01L 43/08* (2013.01)

(58) Field of Classification Search
CPC ..... H01L 43/02; H01L 27/222; H01L 27/228; H01L 43/12; H01L 43/08; H01L 43/10; G11C 11/161; G11C 11/18
See application file for complete search history.

(56) References Cited

U.S. PATENT DOCUMENTS

| | | |
|---|---|---|
| 8,969,983 B2 | 3/2015 | Kanaya |
| 9,076,537 B2 | 7/2015 | Khvalkovskiy |
| 9,997,566 B1 | 6/2018 | Kim |
| 2016/0225423 A1* | 8/2016 | Naik ............... G11C 11/15 |
| 2016/0268336 A1 | 9/2016 | Shum et al. |

(Continued)

FOREIGN PATENT DOCUMENTS

| | | |
|---|---|---|
| KR | 20180086812 | 8/2018 |
| KR | 20180089847 | 8/2018 |

*Primary Examiner* — Ahmed N Sefer
(74) *Attorney, Agent, or Firm* — Myers Bigel, P.A.

(57) ABSTRACT

A semiconductor device includes first and second contact plugs in an insulating layer that is on a substrate, the first and second contact plugs spaced apart from each other. A spin-orbit torque (SOT) line on the insulating layer and overlapping the first and second contact plug is provided. A magnetic tunnel junction (MTJ) is on the SOT line. An upper electrode is on the MTJ. Each of the first and second contact plugs includes a recess region adjacent the SOT line. A sidewall of the recess region is substantially coplanar with a side surface of the SOT line and a side surface of the MTJ.

20 Claims, 6 Drawing Sheets

(56) References Cited

U.S. PATENT DOCUMENTS

| | | |
|---|---|---|
| 2017/0053965 A1 | 2/2017 | Baek et al. |
| 2017/0062702 A1 | 3/2017 | Chung et al. |
| 2017/0069686 A1 | 3/2017 | Nakatsuka |
| 2017/0092693 A1 | 3/2017 | Tan et al. |
| 2017/0092851 A1 | 3/2017 | Han et al. |
| 2017/0345869 A1 | 11/2017 | Park et al. |
| 2018/0006085 A1 | 1/2018 | Chuang et al. |
| 2018/0040813 A1 | 2/2018 | Han |
| 2018/0076263 A1 | 3/2018 | Sugiura et al. |
| 2018/0123022 A1* | 5/2018 | Sasaki ................ H01L 27/228 |
| 2018/0145691 A1 | 5/2018 | Manipatruni |
| 2018/0174635 A1 | 6/2018 | Yoda |
| 2018/0219152 A1 | 8/2018 | Apalkov |
| 2019/0305216 A1* | 10/2019 | Gosavi ................ H01L 43/14 |
| 2019/0326353 A1* | 10/2019 | O'Brien ............... H01F 10/329 |
| 2020/0006424 A1* | 1/2020 | Sato ................ H01F 10/3286 |
| 2020/0006631 A1* | 1/2020 | Sato ..................... H01L 43/08 |
| 2020/0083429 A1 | 3/2020 | Lee et al. |
| 2020/0152251 A1 | 5/2020 | Kim et al. |
| 2021/0036054 A1* | 2/2021 | Gallagher ............ H01L 43/14 |

\* cited by examiner

SEMICONDUCTOR DEVICES INCLUDING SPIN-ORBIT TORQUE LINE AND CONTACT PLUG

CROSS-REFERENCE TO RELATED APPLICATION

This application is a continuation application of, and claims priority from, U.S. application Ser. No. 16/506,391, filed on Jul. 9, 2019, which claims priority under 35 U.S.C. § 119 to and the benefit of Korean Patent Application No. 10-2019-0004423, filed on Jan. 14, 2019, the entire content of which is incorporated herein by reference.

TECHNICAL FIELD

Devices and methods consistent with example embodiments relate to semiconductor devices including a spin-orbit torque (SOT) line and a contact plug, methods of operating the semiconductor devices, and methods of forming the semiconductor devices.

BACKGROUND

Research has been conducted into non-volatile memory devices incorporating magnetic tunnel junctions (MTJs). A device incorporating an MTJ may include a plurality of magnetic layers. For example, the MTJ may include two magnetic layers and a tunnel barrier layer disposed between the two magnetic layers, and a resistance of the MTJ may be changed according to magnetization directions of the two magnetic layers. In detail, the MTJ may have a high resistance when the magnetization directions of the two magnetic layers are anti-parallel to each other. The MTJ may have a low resistance when the magnetization directions of the two magnetic layers are parallel to each other. The memory device incorporating the MTJ may write/sense data by using a difference between the high and low resistances of the MTJ.

However, a process of patterning the plurality of magnetic layers may encounter various difficulties.

SUMMARY

The example embodiments of the inventive concepts are directed to providing improved semiconductor devices, which may provide an advantageous increase in mass production efficiency and may have excellent electrical characteristics, methods of operating the semiconductor devices, and methods of forming the semiconductor devices.

According to example embodiments, there is provided a semiconductor device including first and second contact plugs in an insulating layer that is on a substrate. The first and second contact plugs are spaced apart from each other. A spin-orbit torque (SOT) line is on the insulating layer and overlaps the first and second contact plug. A magnetic tunnel junction (MTJ) is on the SOT line. An upper electrode is on the MTJ. Each of the first and second contact plugs includes a recess region adjacent the SOT line. A sidewall of the recess region is substantially coplanar with a side surface of the SOT line and a side surface of the MTJ.

According to example embodiments, there is provided a semiconductor device including first and second switching elements on a substrate. An insulating layer is on the substrate and on the first and second switching elements. A first contact plug is in the insulating layer and is electrically connected to the first switching element. A second contact plug is in the insulating layer. The second contact plug is spaced apart from the first contact plug and electrically connected to the second switching element. An SOT line is on the insulating layer and overlapping the first and second contact plugs. An MTJ is on the SOT line. An upper electrode is on the MTJ. Each of the first and second contact plugs includes a recess region that is adjacent the SOT line. A sidewall of the recess region is substantially coplanar with a side surface of the SOT line and a side surface of the MTJ.

According to example embodiments, there is provided a semiconductor device including a first switching element and a second switching element on a substrate, a first contact plug electrically connected to the first switching element, a second contact plug electrically connected to the second switching element, the second contact plug spaced apart from the first contact plug, a spin-orbit torque (SOT) line on the substrate, a first portion of the SOT line overlapping the first contact plug and a second portion of the SOT line overlapping the second contact plug, a magnetic tunnel junction (MTJ) on the SOT line, and an upper electrode on the MTJ. An upper surface of the first contact plug comprises a first recess region, and a sidewall of the first recess region is substantially coplanar with a side surface of the SOT line and a side surface of the MTJ.

BRIEF DESCRIPTION OF THE DRAWINGS

The inventive concepts will become more apparent in view of the attached drawings and accompanying detailed description.

Like numbers refer to like elements throughout, and a repeated description thereof may be omitted for brevity.

DETAILED DESCRIPTION

Figure 1:
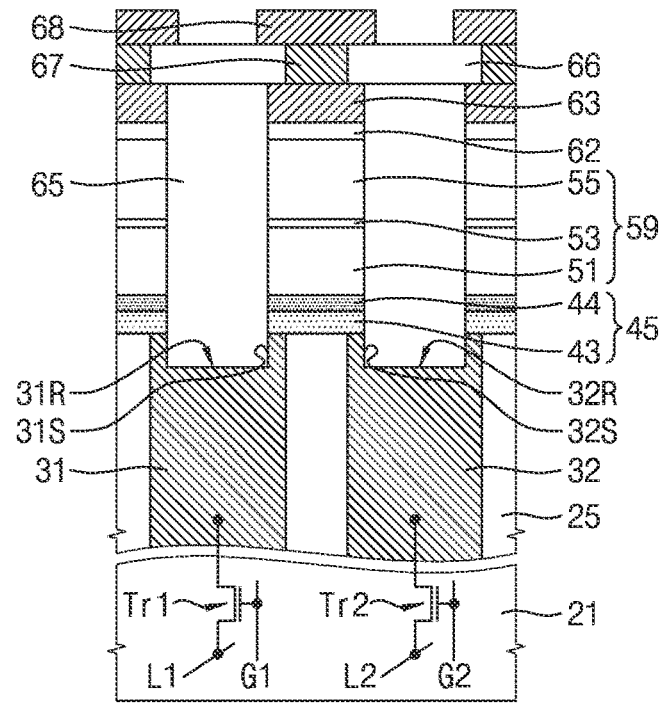
FIG. 1 is a schematic diagram illustrating an example of a semiconductor device and a method of operating the same according to an embodiment of the inventive concepts.
Figure 2:
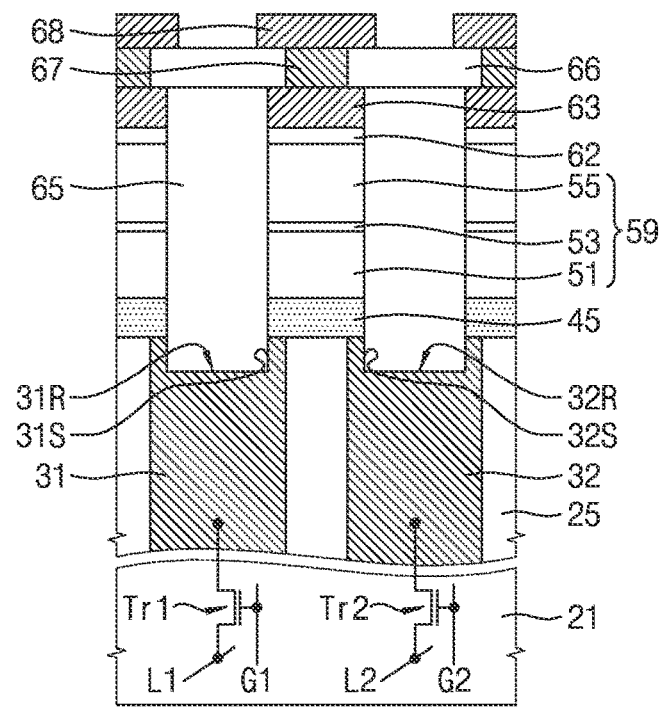
FIG. 2 is a schematic diagram illustrating another example of a semiconductor device and a method of operating the same according to an embodiment of the inventive concepts.

FIGS. 1 and 2 are schematic diagrams illustrating examples of a semiconductor device and a method of operating the same according to an embodiment of the inventive concepts. The semiconductor device according to the embodiment may include a non-volatile memory device such as a magnetoresistive random access memory (MRAM) or a cross-point (X-point) memory. In an embodiment, the semiconductor device may include an embedded MRAM (eMRAM). In an embodiment, the semiconductor device may include a spin-orbit torque in-plane magnetic tunnel junction-MRAM (SOT-iMTJ-MRAM) and/or an SOT perpendicular-MTJ MRAM (SOT-pMTJ-MRAM). As used herein, the term "and/or" includes any and all combinations of one or more of the associated listed items.

Referring to FIG. 1, the semiconductor device according to the embodiment may include a substrate 21, a first insulating layer 25, a plurality of contact plugs 31 and 32, an SOT line 45, an MTJ 59, a capping layer 62, an upper electrode 63, a second insulating layer 65, a third insulating layer 66, an upper plug 67, an upper line 68, and a plurality of switching elements Tr1 and Tr2. It will be understood that, although the terms first, second, third, etc. may be used herein to describe various elements, these terms are only used to distinguish one element from another element. Thus, a first element discussed could be termed a second element without departing from the scope of the inventive concepts.

The plurality of contact plugs 31 and 32 may include a first contact plug 31 and a second contact plug 32. The SOT line 45 may include a lower SOT line 43 and an upper SOT line 44 disposed on the lower SOT line 43. It will be understood that when an element is referred to as being "on" another element, it can be directly on the other element or intervening elements may be present. In contrast, when an element is referred to as being "directly on" another element, there are no intervening elements present. Other words used to describe the relationship between elements or layers should be interpreted in a like fashion (e.g., "between" versus "directly between," "adjacent" versus "directly adjacent").

The MTJ 59 may include a storage layer 51, a tunnel layer 53, and a reference layer 55. The plurality of switching elements Tr1 and Tr2 may include a first transistor Tr1 and a second transistor Tr2.

The first insulating layer 25 may be on and, in some embodiments, cover the substrate 21. The plurality of contact plugs 31 and 32 may be in and/or pass through the first insulating layer 25. The first contact plug 31 and the second contact plug 32 may be spaced apart from each other. Each of the plurality of contact plugs 31 and 32 may have a vertical length greater than a horizontal width thereof. As used herein, a vertical direction may be a direction perpendicular to a surface (e.g., a top surface or a bottom surface that is opposite the top surface) of the substrate 21. As used herein, a horizontal direction may be a direction parallel to the surface of the substrate 21. A vertical length of each of the plurality of contact plugs 31 and 32 may be greater than a thickness (e.g., a vertical dimension) of the SOT line 45.

One end of the first transistor Tr1 may be connected to the first contact plug 31, another end of the first transistor Tr1 may be connected to a first interconnection L1, and a gate electrode of the first transistor Tr1 may be connected to a first gate line G1. One end of the second transistor Tr2 may be connected to the second contact plug 32, another end of the second transistor Tr2 may be connected to a second interconnection L2, and a gate electrode of the second transistor Tr2 may be connected to a second gate line G2.

In an embodiment, each of the plurality of the first and second transistors Tr1 and Tr2 may be switching elements and may include, for example and without limitation, a fin field-effect transistor (finFET), a multi-bridge channel (MBC) transistor, a nano-wire transistor, a vertical transistor, a recess channel transistor, a three-dimensional (3D) transistor, a planar transistor, a diode, or a combination thereof.

The SOT line 45 may be disposed on the first insulating layer 25, and portions of the SOT line 45 may vertically overlap the first contact plug 31 and the second contact plug 32. For example, in some embodiments, a first portion of the SOT line 45 may vertically overlap the first contact plug 31 and a second portion of the SOT line 45 may vertically overlap the second contact plug 32. It will be understood that "an element A vertically overlapping an element B" (or similar language) as used herein means that a vertical line intersects both the elements A and B. The SOT line 45 may be in direct contact with the first contact plug 31 and the second contact plug 32. The MTJ 59 may be disposed on the SOT line 45. The capping layer 62 may be disposed on the MTJ 59. The upper electrode 63 may be disposed on the capping layer 62.

The capping layer 62, the MTJ 59, and the SOT line 45 may be formed in a self-aligned manner under the upper electrode 63. The SOT line 45 may have substantially the same area as the MTJ 59. Side surfaces of the capping layer 62, the MTJ 59, and the SOT line 45 may be vertically aligned with side surfaces of the upper electrode 63. At least a portion of each of the upper electrode 63, the capping layer 62, the MTJ 59, and the SOT line 45 may overlap the first contact plug 31 and/or the second contact plug 32.

The plurality of contact plugs 31 and 32 may include recess regions 31R and 32R, which may be disposed outside (e.g., physically separate and/or remote from) the upper electrode 63, the capping layer 62, the MTJ 59, and the SOT line 45. In some embodiments, as illustrated in FIG. 1, the recess regions 31R and 32R may be adjacent the SOT line 45. The first contact plug 31 may include a first recess region 31R. In some embodiments, the first recess region 31R may be in an upper surface of the first contact plug 31 (e.g., a major surface of the first contact plug 31 that is farthest from the substrate 21). The second contact plug 32 may include a second recess region 32R. In some embodiments, the second recess region 32R may be in an upper surface of the second contact plug 32 (e.g., a major surface of the second contact plug 32 that is farthest from the substrate 21).

A first sidewall 31S of the first recess region 31R may be vertically aligned with side surfaces of the SOT line 45, the MTJ 59, the capping layer 62, and the upper electrode 63. The first sidewall 31S of the first recess region 31R may be substantially coplanar with side surfaces of the SOT line 45, the MTJ 59, the capping layer 62, and the upper electrode 63. A second sidewall 32S of the second recess region 32R may be vertically aligned with side surfaces of the SOT line 45, the MTJ 59, the capping layer 62, and the upper electrode 63. The second sidewall 32S of the second recess region 32R may be substantially coplanar with side surfaces of the SOT line 45, the MTJ 59, the capping layer 62, and the upper electrode 63.

The lower SOT line 43 may be in direct contact with the first contact plug 31 and the second contact plug 32. The upper SOT line 44 may be in direct contact with the MTJ 59. A thickness (e.g., a vertical dimension) of the upper SOT line 44 may be different (e.g., greater or smaller) than that of the lower SOT line 43. In some embodiments, the thickness of the upper SOT line 44 may be smaller than that of the lower SOT line 43. The upper SOT line 44 may include a material having a lower electrical resistivity than that of the lower SOT line 43. The upper SOT line 44 may include a material having a higher spin orbit-coupling, a larger spin hall angle, and/or a higher spin/electrical current conductivity than that of the lower SOT line 43.

The storage layer 51 may face the reference layer 55. The tunnel layer 53 may be disposed between the storage layer 51 and the reference layer 55. The storage layer 51 may be in direct contact with the upper SOT line 44. At least a portion of the storage layer 51 may vertically overlap the first contact plug 31 and/or the second contact plug 32. At least a portion of the reference layer 55 may vertically overlap the first contact plug 31 and/or the second contact plug 32. The capping layer 62 may be disposed between the reference layer 55 and the upper electrode 63. The first sidewall 31S of the first recess region 31R may be substantially coplanar with side surfaces of the SOT line 45, the storage layer 51, the reference layer 55, the capping layer 62, and the upper electrode 63. The second sidewall 32S of the second recess region 32R may be substantially coplanar with side surfaces of the SOT line 45, the storage layer 51, the reference layer 55, the capping layer 62, and the upper electrode 63.

In an embodiment, when the reference layer 55 and the storage layer 51 have a parallel magnetic polarization, the MTJ 59 may exhibit a low-resistance state. The low-resistance state may correspond to data '0' (e.g., a low logic level), though the inventive concepts are not limited thereto. When the reference layer 55 and the storage layer 51 have an anti-parallel magnetic polarization, the MTJ 59 may exhibit a high-resistance state. The high-resistance state may correspond to data '1' (e.g., a high logic level), though the inventive concepts are not limited thereto. The non-volatile memory device may be implemented using a spin-polarized current of the MTJ 59.

A magnetic polarization of the reference layer 55 may be fixed. When current flows through the SOT line 45, the current may interact with the spin of a lattice due to a spin hall effect (SHE) so that spin polarization may occur in a direction perpendicular to a current direction. The magnetic polarization of the storage layer 51 may be switched due to the SHE of the SOT line 45.

In an embodiment, when a first write current is supplied to the SOT line 45 between the first contact plug 31 and the second contact plug 32 in a first direction by using the first transistor Tr1 and the second transistor Tr2, the storage layer 51 may receive a spin torque in a second direction due to the SHE, and the magnetic polarization of the storage layer 51 may be switched to the second direction. The second direction may intersect the first direction. In some embodiments, the second direction may be perpendicular to the first direction. When a second write current is supplied to the SOT line 45 between the first contact plug 31 and the second contact plug 32 in a direction opposite the first direction by using the first transistor Tr1 and the second transistor Tr2, the magnetic polarization of the storage layer 51 may be switched to a direction opposite the second direction.

By applying a read current between the upper line 68 and the first contact plug 31 or applying a read current between the upper line 68 and the second contact plug 32 using the first transistor Tr1 or the second transistor Tr2, data of the MTJ 59 may be read.

In an embodiment, although it is assumed that the MTJ 59 includes an in-plane MTJ (iMTJ), the inventive concepts may be applied similarly to a case in which the MTJ 59 includes a perpendicular MTJ (pMTJ).

Referring to FIG. 2, a semiconductor device according to an embodiment of the inventive concepts may include a substrate 21, a first insulating layer 25, a plurality of contact plugs 31 and 32, an SOT line 45, a MTJ 59, a capping layer 62, an upper electrode 63, a second insulating layer 65, a third insulating layer 66, an upper plug 67, an upper line 68, and a plurality of switching elements Tr1 and Tr2. The SOT line 45 may include a single layer.

Figure 3:
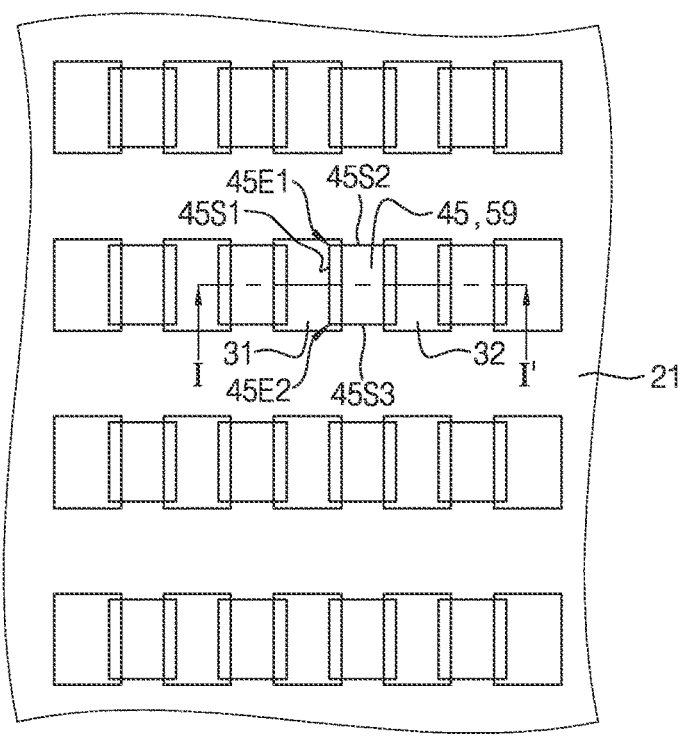
FIG. 3 is a plan view illustrating an example of a layout of a semiconductor device according to embodiments of the inventive concepts.
Figure 4:
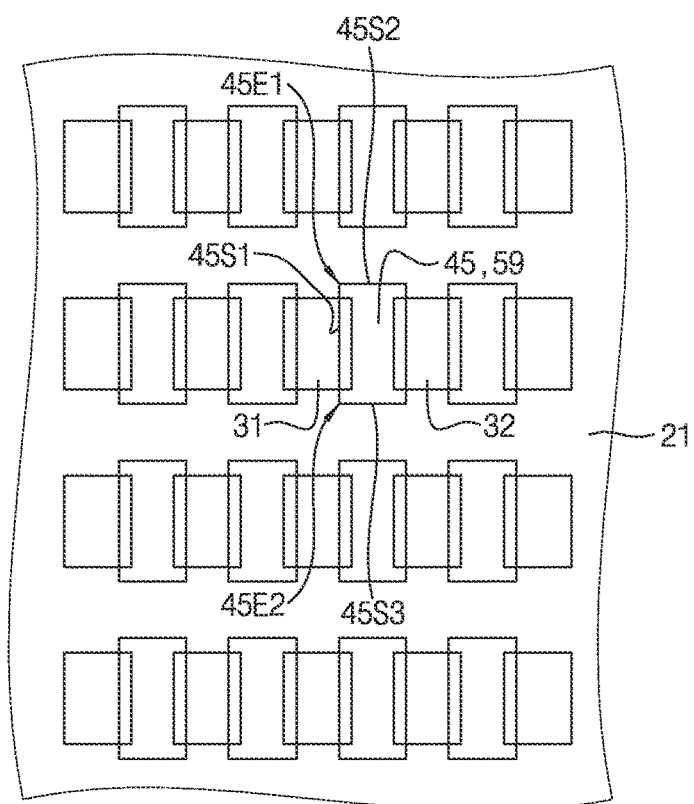
FIG. 4 is a plan view illustrating another example of a layout of a semiconductor device according to embodiments of the inventive concepts.

FIGS. 3 and 4 are plan views illustrating example layouts of semiconductor devices according to embodiments of the inventive concepts.

Referring to FIG. 3, a plurality of contact plugs 31 and 32, a plurality of SOT lines 45, and a plurality of MTJs 59 may be regularly and repeatedly arranged on a substrate 21 in a row direction and a column direction. Each of the plurality of MTJs 59 may have a smaller width (e.g., as illustrated in the column direction in FIG. 3) than each of the plurality of contact plugs 31 and 32. An area of each of the plurality of SOT lines 45 may be substantially equal to that of a corresponding one of the plurality of MTJs 59. As the SOT lines 45 are respectively disposed on the plurality of MTJs 59, they are designated in FIGS. 3 and 4 using a single designator for convenience.

Each of the plurality of SOT lines 45 may include a first side surface 45S1, a second side surface 45S2, a third side surface 45S3, a first edge 45E1, and a second edge 45E2. The first side surface 45S1 may vertically overlap the first contact plug 31. The second side surface 45S2 may be in contact with the first side surface 45S1 and portions of the second side surface 45S2 may vertically overlap the first contact plug 31 and the second contact plug 32. The first edge 45E1 may be formed between the first side surface 45S1 and the second side surface 45S2 and may vertically overlap the first contact plug 31. The third side surface 45S3 may face the second side surface 45S2. The third side surface 45S3 may be in contact with the first side surface 45S1, and portions of the third side surface 45S3 may vertically overlap the first contact plug 31 and the second contact plug 32. The second edge 45E2 may be formed between the first side surface 45S1 and the third side surface 45S3 and may vertically overlap the first contact plug 31.

Referring to FIG. 4, a plurality of contact plugs 31 and 32, a plurality of SOT lines 45, and a plurality of MTJs 59 may be regularly and repeatedly arranged on a substrate 21 in a row direction and a column direction. Each of the plurality of MTJs 59 may have a greater width than each of the plurality of contact plugs 31 and 32 (e.g., as illustrated in the column direction in FIG. 3).

Each of the plurality of SOT lines 45 may include a first side surface 45S1, a second side surface 45S2, a third side surface 45S3, a first edge 45E1, and a second edge 45E2. Portions of the first side surface 45S1 may vertically overlap the first contact plug 31. The second side surface 45S2 may be in contact with the first side surface 45S1 and disposed outside (e.g., separate and/or remote from) the first contact plug 31 and the second contact plug 32. In some embodiments, the second side surface 45S2 may not overlap the first contact plug 31 or the second contact plug 32. The first edge 45E1 may be formed between the first side surface 45S1 and the second side surface 45S2 and disposed outside (e.g., separate and/or remote from) the first contact plug 31. In some embodiments, the first edge 45E1 may not overlap the first contact plug 31. The third side surface 45S3 may face the second side surface 45S2. The third side surface 45S3 may be in contact with the first side surface 45S1 and disposed outside (e.g., separate and/or remote from) the first contact plug 31 and the second contact plug 32. In some embodiments, the third side surface 45S3 may not overlap the first contact plug 31 or the second contact plug 32. The second edge 45E2 may be formed between the first side surface 45S1 and the third side surface 45S3 and disposed outside (e.g., separate and/or remote from) the first contact plug 31. In some embodiments, the second edge 45E2 may not overlap the first contact plug 31.

Although each of the plurality of MTJs 59 and each of the plurality of contact plugs 31 and 32 are illustrated as a tetragonal shape for brevity, each of the plurality of MTJs 59 and each of the plurality of contact plugs 31 and 32 may have, for example, a polygonal shape, a polygonal shape having round edges, an elliptical shape, a torus shape, an amoebic shape, or a combination thereof.

FIGS. 5 to 8 are cross-sectional views taken along a line I-I' of FIG. 3 illustrating a method of forming a semiconductor device according to an embodiment of the inventive concepts.

Figure 5:
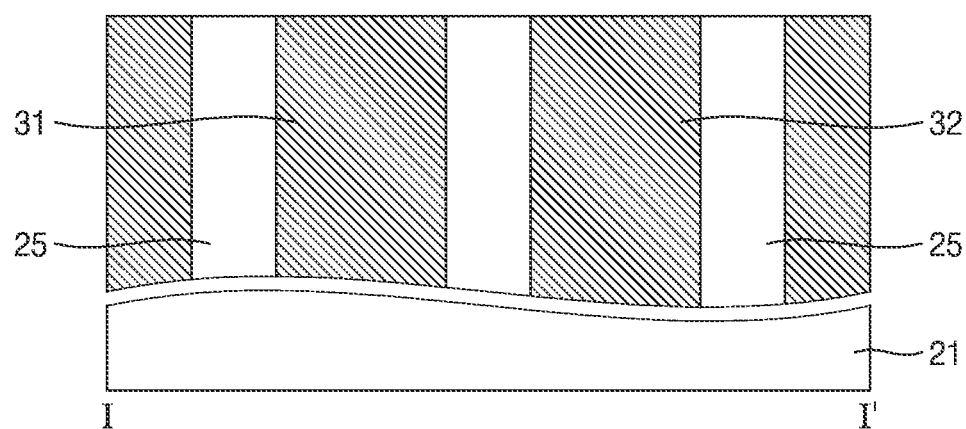
FIGS. 5 to 8 are cross-sectional views taken along a line I-I' of FIG. 3 illustrating a method of forming a semiconductor device according to an embodiment of the inventive concepts.

Referring to FIGS. 3 and 5, a first insulating layer 25 and a plurality of contact plugs 31 and 32 may be formed on a substrate 21. The substrate 21 may include, for example, a semiconductor substrate, such as a silicon wafer or a silicon on insulator (SOI) wafer. Various kinds of active/passive elements, such as transistors and interconnections, may be further formed in the substrate 21 and/or on the substrate 21, but descriptions thereof will be omitted for brevity.

The first insulating layer 25 may be on and, in some embodiments, cover the substrate 21. The first insulating layer 25 may include an insulating material, such as, for example, silicon oxide, silicon nitride, silicon oxynitride, a low-k dielectric material, a high-k dielectric material, or a combination thereof. The plurality of contact plugs 31 and 32 may include a first contact plug 31 and a second contact plug 32 spaced apart from the first contact plug 31. Each of the plurality of contact plugs 31 and 32 may be formed in and, in some embodiments, vertically passing through the first insulating layer 25. Top surfaces of the first insulating layer 25 and the plurality of contact plugs 31 and 32 may be exposed and substantially coplanar with each other. Each of the plurality of contact plugs 31 and 32 may include a conductive material such as, for example, a metal, a metal nitride, a metal oxide, a metal silicide, polysilicon, conductive carbon, or a combination thereof. For example, each of the plurality of contact plugs 31 and 32 may include tungsten (W), titanium (Ti), titanium nitride (TiN), tantalum (Ta), tantalum nitride (TaN), cobalt (Co), or a combination thereof.

Figure 6:
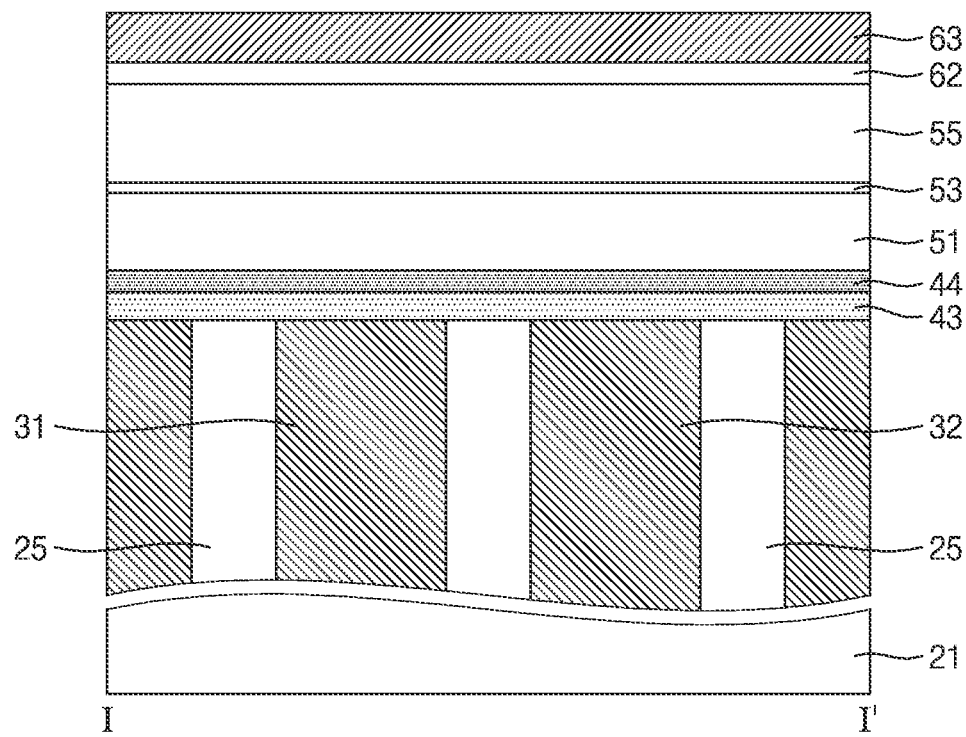

Referring to FIGS. 3 and 6, a lower SOT line 43, an upper SOT line 44, a storage layer 51, a tunnel layer 53, a reference layer 55, a capping layer 62, and an upper electrode 63 may be sequentially stacked on the first insulating layer 25 and the plurality of contact plugs 31 and 32.

Figure 7:
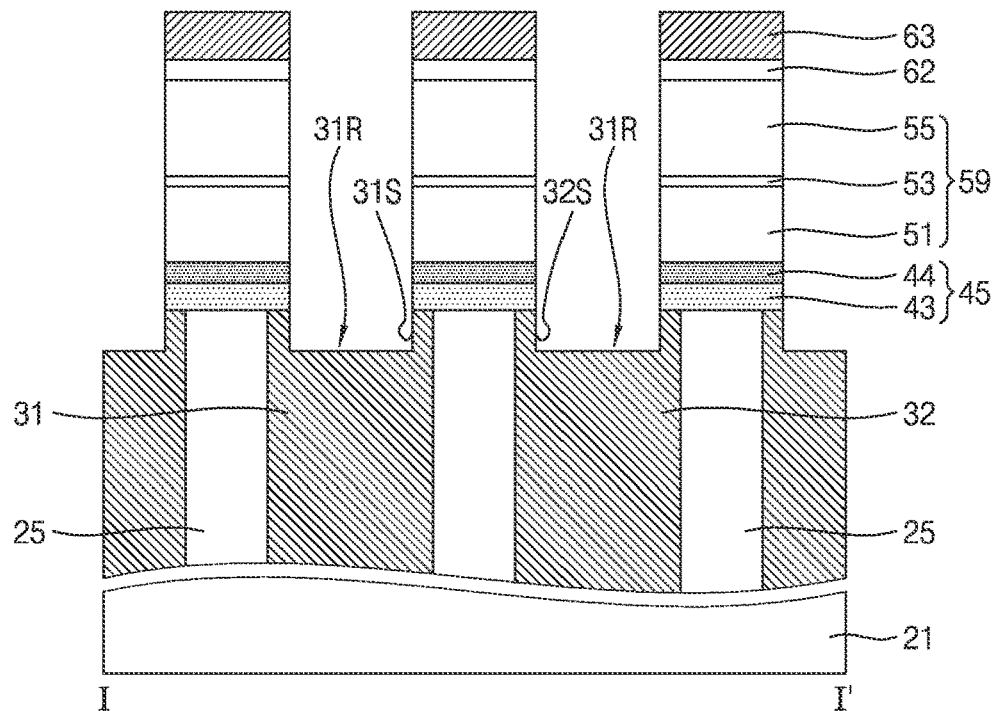

Referring to FIGS. 3 and 7, the upper electrode 63, the capping layer 62, the reference layer 55, the tunnel layer 53, the storage layer 51, the upper SOT line 44, and the SOT line 43 may be partially removed using a patterning process, and recess regions 31R and 32R may be formed in the plurality of contact plugs 31 and 32. The reference layer 55, the tunnel layer 53, and the storage layer 51 may constitute a magnetic tunnel junction (MTJ) 59. The lower SOT line 43 and the upper SOT line 44 may constitute an SOT line 45.

The upper electrode 63 may serve as a hard mask pattern during a patterning process. The capping layer 62, the MTJ 59, and the SOT line 45 may be formed in a self-aligned manner under the upper electrode 63. The recess regions 31R and 32R may be formed in a self-aligned manner outside (e.g., physically separate and/or remote from) the upper electrode 63, the capping layer 62, the MTJ 59, and the SOT line 45. In some embodiments, the recess regions 31R and 32R, may be formed adjacent the SOT line 45.

The recess regions 31R and 32R may include a first recess region 31R formed on a top surface of the first contact plug 31, and a second recess region 32R formed on a top surface of the second contact plug 32. A first sidewall 31S of the first recess region 31R may be substantially coplanar with side surfaces of the upper electrode 63, the capping layer 62, the MTJ 59, and the SOT line 45. A second sidewall 32S of the second recess region 32R may be substantially coplanar with side surfaces of the upper electrode 63, the capping layer 62, the MTJ 59, and the SOT line 45.

The SOT line 45 may include, for example, a normal metal. The SOT line 45 may include, for example, tungsten (W), platinum (Pt), tantalum (Ta), tantalum oxide (TaO), platinum oxide (PtO), tungsten oxide (WO), bismuth antimonide (BiSb), bismuth selenide (BiSe), hafnium (Hf), hafnium oxide (HfO), gold (Au), copper gold (CuAu), copper lead (CuPb), copper platinum (CuPt), copper bismuth (CuBi), copper iridium (CuIr), or a combination thereof. A thickness (e.g., a dimension in the vertical direction) of the upper SOT line 44 may be different (e.g., greater or smaller) than that of the lower SOT line 43. In some embodiments, the thickness of the upper SOT line 44 may be smaller than that of the lower SOT line 43. The upper SOT line 44 may include a material having a lower electrical resistivity than that of the lower SOT line 43. The upper SOT line 44 may include a material having a higher spin-orbit coupling, a larger spin hall angle, and/or a higher spin/electrical current conductivity than the lower SOT line 43.

The storage layer 51 may include a free layer. In an embodiment, the storage layer 51 may include a magnetic material such as, for example, cobalt iron (CoFe), cobalt iron boron (CoFeB), or a combination thereof. In some embodiments, the storage layer 51 may include at least one synthetic antiferromagnetic (SAF) structure. The SAF structure may include two magnetic layers and a spacer layer interposed between the two magnetic layers. For example, the SAF structure may include a cobalt iron boron (CoFeB) layer, a ruthenium (Ru) layer, and a cobalt iron (CoFe) layer, which are sequentially stacked.

The tunnel layer 53 may correspond to a tunnel barrier layer. The tunnel layer 53 may include, for example, a metal oxide such as magnesium oxide (MgO), ruthenium oxide (RuO), vanadium oxide (VO), tungsten oxide (WO), tantalum oxide (TaO), hafnium oxide (HID), molybdenum oxide (MoO), or a combination thereof. For example, the tunnel layer 53 may be a MgO layer. The reference layer 55 may include, for example, a magnetic material such as CoFe, CoFeB, or a combination thereof. The reference layer 55 may include a pinned layer, a fixed layer, or a combination thereof. In some embodiments, the reference layer 55 may include at least one SAF structure.

The capping layer 62 may include a metal oxide such as MgO, RuO, VO, WO, TaO, HID, MoO, or a combination thereof. The upper electrode 63 may include a conductive material such as, for example, a metal, a metal nitride, a metal oxide, a metal silicide, polysilicon, conductive carbon, or a combination thereof. For example, the upper electrode 63 may include titanium (Ti), titanium nitride (TiN), tantalum (Ta), tantalum nitride (TaN), tungsten (W), tungsten nitride (WN), or a combination thereof.

Figure 8:
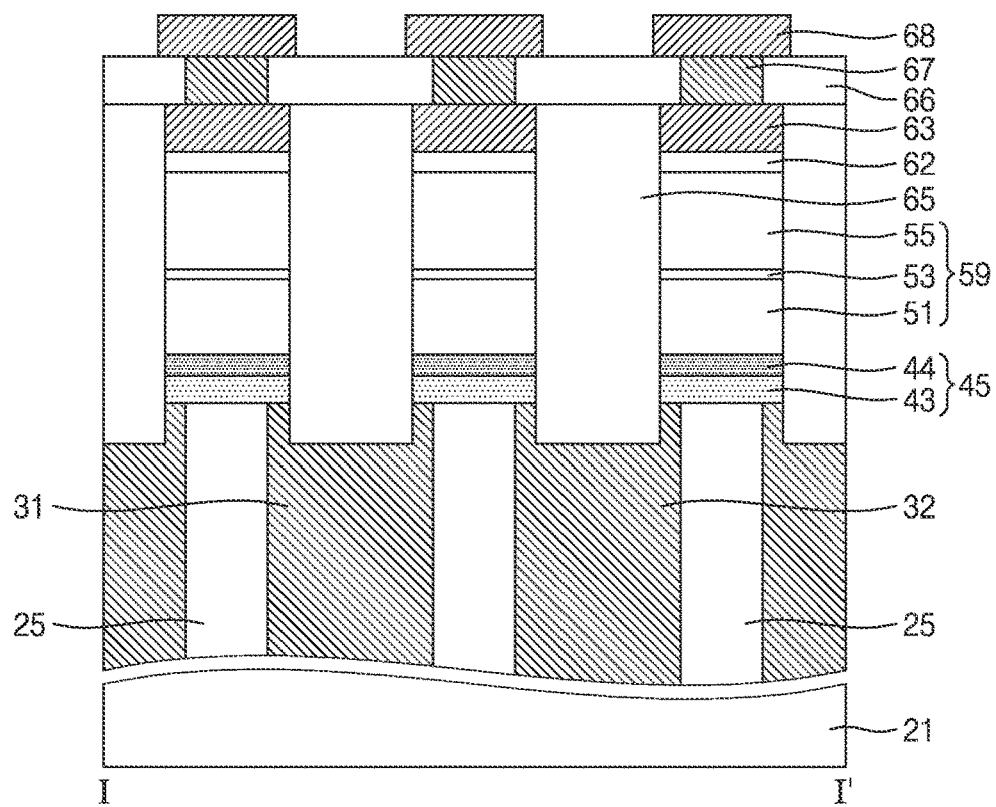

Referring to FIGS. 3 and 8, a second insulating layer 65 may be formed to be within and, in some embodiments, fill the first and second recess regions 31R and 32R and be on and, in some embodiments, cover the side surfaces of the SOT line 45, the MTJ 59, the capping layer 62, and/or the upper electrode 63. A third insulating layer 66 may be formed to be on and, in some embodiments, cover the second insulating layer 65 and the upper electrode 63. An upper plug 67 may be formed in and, in some embodiments, passing through the third insulating layer 66 and come into contact with the upper electrode 63. An upper line 68 may be formed on the third insulating layer 66 and may be in contact with the upper plug 67.

Each of the second insulating layer 65 and the third insulating layer 66 may include an insulating material such as, for example, silicon oxide, silicon nitride, silicon oxynitride, a low-k dielectric material, a high-k dielectric material, or a combination thereof. Each of the upper plug 67 and the upper line 68 may include a conductive material, such as, for example, a metal, a metal nitride, a metal oxide, a metal silicide, polysilicon, conductive carbon, or a combination thereof.

Figure 9:
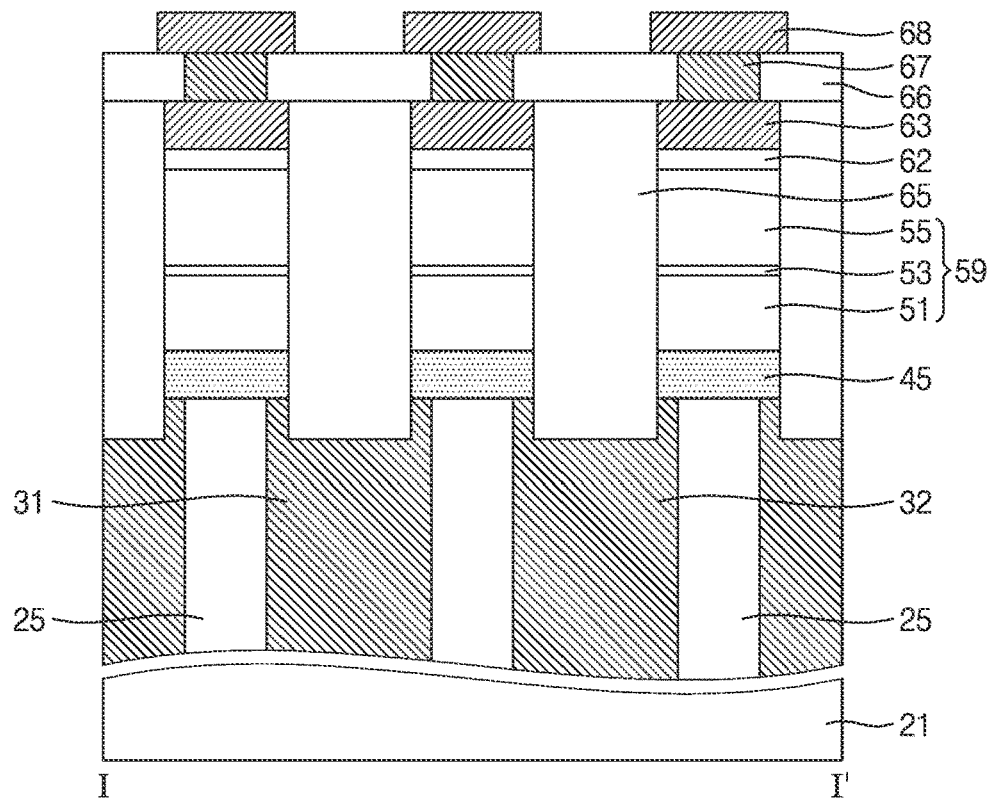
FIG. 9 is a cross-sectional view taken along a line I-I' of FIG. 3 illustrating a method of forming a semiconductor device according to an embodiment of the inventive concepts.

FIG. 9 is a cross-sectional view taken along a line I-I' of FIG. 3 illustrating a method of forming a semiconductor device according to an embodiment of the inventive concepts. Referring to FIGS. 3 and 9, an SOT line 45 may include a single layer. In some embodiments, the embodiment of FIG. 9 may be otherwise processed using operations similar to those described with respect to FIGS. 3 to 8, and a duplicate description thereof will be omitted for brevity.

Figure 10:
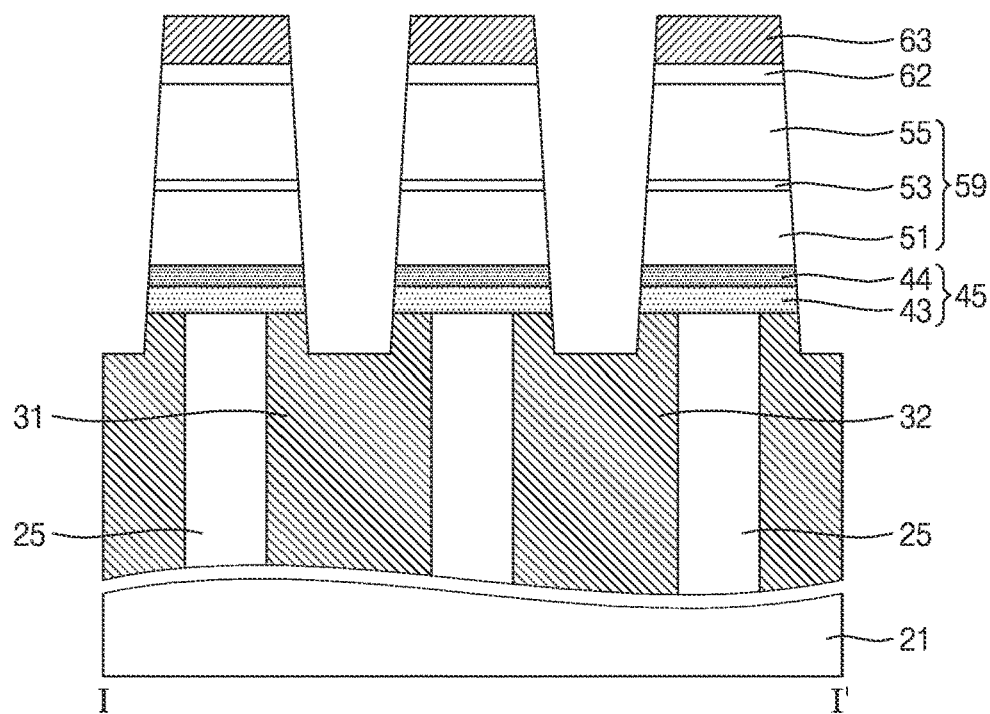
FIG. 10 is a cross-sectional view taken along a line I-I' of FIG. 3 illustrating a method of forming a semiconductor device according to an embodiment of the inventive concepts.

FIG. 10 is a cross-sectional view taken along a line I-I' of FIG. 3 illustrating a method of forming a semiconductor device according to an embodiment of the inventive concepts. Referring to FIGS. 3 and 10, side surfaces of an upper electrode 63, a capping layer 62, an MTJ 59, and an SOT line 45 may have inclined profiles. It will be understood that, in some embodiments, the SOT line 45 of FIG. 10 may include a single layer. In some embodiments, the embodiment of FIG. 10 may be otherwise processed using operations similar to those described with respect to FIGS. 3 to 8, and a duplicate description thereof will be omitted for brevity.

Figure 11:
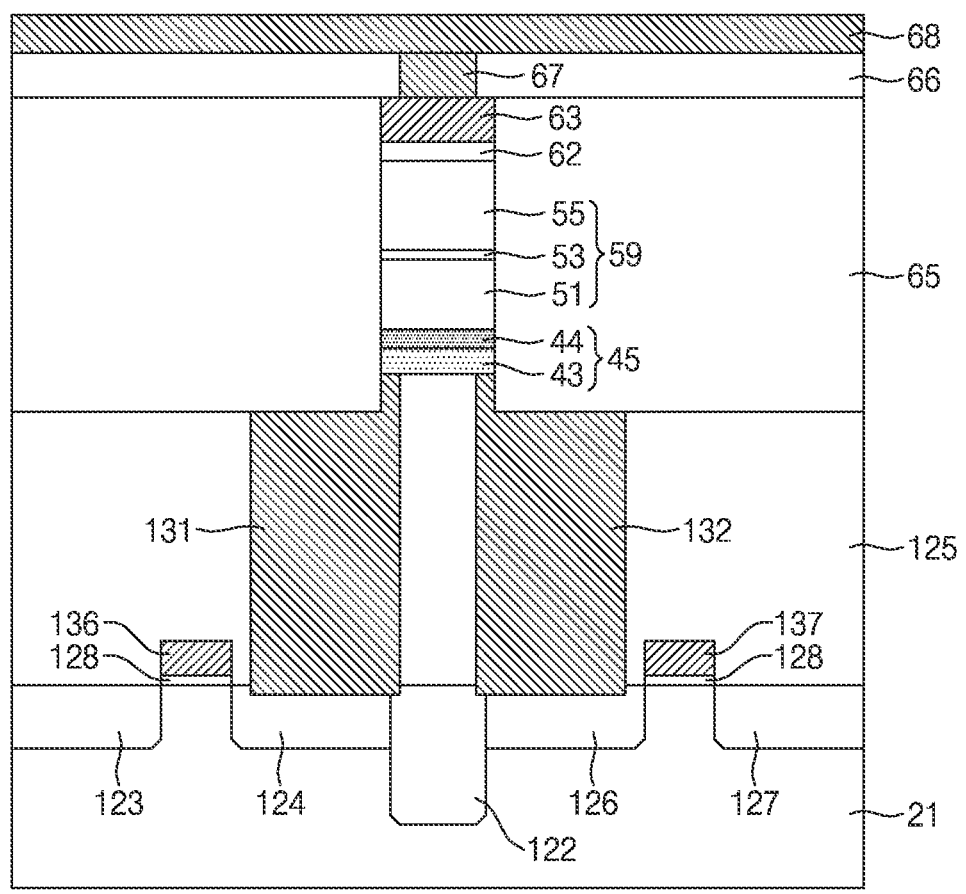
FIG. 11 is a cross-sectional view illustrating another example of a semiconductor device according to an embodiment of the inventive concepts.

FIG. 11 is a cross-sectional view illustrating another example of a semiconductor device according to an embodiment of the inventive concepts.

Referring to FIG. 11, a device isolation layer 122, a plurality of source regions 123 and 127, and a plurality of drain regions 124 and 126 may be formed in a substrate 21. A gate insulating layer 128 and a plurality of gate electrodes 136 and 137 may be formed on the substrate 21. A first insulating layer 125 may be formed on the substrate 21 to be on and, in some embodiments, cover the device isolation layer 122, the plurality of source regions 123 and 127, the plurality of drain regions 124 and 126, the gate insulating layer 128, and the plurality of gate electrodes 136 and 137.

The device isolation layer 122 may be formed using a shallow trench isolation (STI) method. The device isolation layer 122 may include an insulating material such as, for example, silicon oxide, silicon nitride, silicon oxynitride, a low-k dielectric material, a high-k dielectric material, or a combination thereof. Each of the plurality of source regions 123 and 127 and each of the plurality of drain regions 124 and 126 may include impurities of a conductivity type which is different from that of the substrate 21. The plurality of source regions 123 and 127 may include a first source region 123 and a second source region 127. The plurality of drain regions 124 and 126 may include a first drain region 124 and a second drain region 126.

The gate insulating layer 128 may include an insulating material such as, for example, silicon oxide, silicon nitride, silicon oxynitride, a high-k dielectric material, or a combination thereof. Each of the plurality of gate electrodes 136 and 137 may include a conductive material, such as, for example, a metal, a metal nitride, a metal oxide, a metal silicide, polysilicon, conductive carbon, or a combination thereof. The plurality of gate electrodes 136 and 137 may include a first gate electrode 136 and a second gate electrode 137. The first gate electrode 136, the first source region 123, and the first drain region 124 may constitute a first transistor. The second gate electrode 137, the second source region 127, and the second drain region 126 may constitute a second transistor.

A plurality of contact plugs 131 and 132 may be formed in and, in some embodiments, passing through the first insulating layer 125 and be in contact with the plurality of drain regions 124 and 126. The plurality of contact plugs 131 and 132 may include a first contact plug 131 and a second contact plug 132 spaced apart from the first contact plug 131. The first contact plug 131 may be in and/or pass through the first insulating layer 125 and be in direct contact with the first drain region 124. The second contact plug 132 may be in and/or pass through the first insulating layer 125 and be in direct contact with the second drain region 126.

A lower SOT line 43, an upper SOT line 44, a storage layer 51, a tunnel layer 53, a reference layer 55, a capping layer 62, and an upper electrode 63 may be sequentially stacked on the first insulating layer 125 and the plurality of contact plugs 131 and 132.

A second insulating layer 65 may be formed on the first insulating layer 125 and the plurality of contact plugs 131 and 132 to be on and, in some embodiments, cover the side surfaces of the SOT line 45, the MTJ 59, the capping layer 62, and/or the upper electrode 63. A third insulating layer 66 may be formed to be on and, in some embodiments, cover the second insulating layer 65 and the upper electrode 63. An upper plug 67 may be formed in and, in some embodiments, passing through the third insulating layer 66. The upper plug 67 may be in contact with the upper electrode 63. An upper line 68 may be formed on the third insulating layer 66 and may be in contact with the upper plug 67. In an embodiment, the upper line 68 may correspond to a bit line.

According to the example embodiments of the inventive concepts, an SOT line overlapping first and second contact plugs can be provided. An MTJ and an upper electrode can be sequentially stacked on the SOT line. Each of the first and second contact plugs can include a recess region disposed outside the SOT line. A sidewall of the recess region may be substantially coplanar with side surfaces of the SOT line and the MTJ. A semiconductor device that is advantageous for an increase in mass production efficiency and that has excellent electrical characteristics can be implemented.

While the embodiments of the inventive concepts have been described with reference to the accompanying drawings, it should be understood by those skilled in the art that various modifications may be made without departing from the scope of the inventive concepts and without changing essential features thereof. Therefore, the above-described embodiments should be considered in a descriptive sense only and not for purposes of limitation.

What is claimed is:

1. A semiconductor device comprising:
   a first contact plug and a second contact plug in an insulating layer that is on a substrate, the first and second contact plugs spaced apart from each other;
   at least a portion of a magnetic tunnel junction (MTJ) overlapping at least a portion of a spin-orbit torque (SOT) line and overlapping at least a portion of the first and second contact plugs, wherein the MTJ is on the SOT line; and an upper electrode on the MTJ, wherein the MTJ is between the SOT line and the upper electrode.

2. The semiconductor device of claim 1, wherein the SOT line comprises:
a lower SOT line; and
an upper SOT line on the lower SOT line, the upper SOT line being in direct contact with the MTJ.

3. The semiconductor device of claim 2, wherein the upper SOT line has a smaller thickness in a first direction perpendicular to the substrate than the lower SOT line.

4. The semiconductor device of claim 2, wherein the upper SOT line comprises a material having a lower electrical resistivity than the lower SOT line.

5. The semiconductor device of claim 2, wherein the upper SOT line comprises a material having a higher spin-orbit coupling, a larger spin hall angle, a higher spin/electrical current conductivity than the lower SOT line, or a combination thereof.

6. The semiconductor device of claim 1, wherein each of the first and second contact plugs comprises an upper surface with a recess region therein that is adjacent the SOT line.

7. The semiconductor device of claim 6, wherein a sidewall of the recess region is substantially coplanar with a side surface of the SOT line and a side surface of the MTJ.

8. The semiconductor device of claim 6, wherein the MTJ comprises:
a reference layer;
a storage layer; and
a tunnel layer between the reference layer and the storage layer,
wherein the storage layer is in direct contact with the SOT line.

9. The semiconductor device of claim 8, wherein a side surface of the reference layer and a side surface of the storage layer are substantially coplanar with a side surface of the upper electrode, a side surface of the SOT line, and a sidewall of the recess region.

10. The semiconductor device of claim 8, wherein the storage layer and the reference layer overlap the first and second contact plugs.

11. The semiconductor device of claim 1, further comprising a first transistor and a second transistor on the substrate,
wherein the first contact plug is electrically connected to the first transistor, and
wherein the second contact plug is electrically connected to the second transistor.

12. The semiconductor device of claim 1, wherein an area, when viewed in a plan view, of the SOT line is substantially equal to an area, when viewed in the plan view, of the MTJ.

13. The semiconductor device of claim 1, wherein the upper electrode overlaps the first and second contact plugs.

14. The semiconductor device of claim 1, wherein the SOT line comprises tungsten (W), platinum (Pt), tantalum (Ta), tantalum oxide (TaO), platinum oxide (PtO), tungsten oxide (WO), bismuth antimonide (BiSb), bismuth selenide (BiSe), hafnium (Hf), hafnium oxide (HfO), gold (Au), copper gold (CuAu), copper lead (CuPb), copper platinum (CuPt), copper bismuth (CuBi), copper iridium (CuIr), or a combination thereof.

15. The semiconductor device of claim 1, wherein the MTJ directly contacts the SOT line.

16. A semiconductor device comprising:
a first contact plug and a second contact plug in an insulating layer that is on a substrate, the first and second contact plugs spaced apart from each other;
at least a portion of a magnetic tunnel junction (MTJ) overlapping at least a portion of a spin-orbit torque (SOT) line and overlapping at least a portion of the first and second contact plugs; and
an upper electrode on the MTJ,
wherein each of the first and second contact plugs comprises an upper surface with a recess region therein that is adjacent the SOT line,
wherein a sidewall of the recess region is substantially coplanar with a side surface of the SOT line and a side surface of the MTJ, and
wherein a side surface of the upper electrode is substantially coplanar with the side surface of the SOT line, the side surface of the MTJ, and the sidewall of the recess region.

17. A semiconductor device comprising:
a first switching element and a second switching element on a substrate;
an insulating layer on the first and second switching elements;
a first contact plug in the insulating layer;
a second contact plug in the insulating layer, the second contact plug spaced apart from the first contact plug;
at least a portion of a magnetic tunnel junction (MTJ) overlapping at least a portion of a spin-orbit torque (SOT) line and overlapping at least a portion of the first and second contact plugs, wherein the MTJ is on the SOT line; and
an upper electrode on the MTJ, wherein the MTJ is between the SOT line and the upper electrode.

18. The semiconductor device of claim 17, wherein each of the first and second contact plugs comprises an upper surface with a recess region therein that is adjacent the SOT line.

19. The semiconductor device of claim 18, wherein a sidewall of the recess region is substantially coplanar with a side surface of the SOT line and a side surface of the MTJ.

20. The semiconductor device of claim 17, wherein the first switching element is a first transistor electrically connected to the first contact plug, and
wherein the second switching element is a second transistor electrically connected to the second contact plug.

* * * * *